(12) United States Patent
Kim et al.

(10) Patent No.: US 10,950,480 B2
(45) Date of Patent: Mar. 16, 2021

(54) ADHESIVE TAPE STICKING APPARATUS AND METHOD OF MANUFACTURING A SEMICONDUCTOR PACKAGE USING THE SAME

(71) Applicant: SAMSUNG ELECTRONICS CO., LTD., Suwon-si (KR)

(72) Inventors: Young-Min Kim, Asan-si (KR); Joo-Hyung Lee, Sejong-si (KR); Hae-Gu Lee, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 712 days.

(21) Appl. No.: 15/443,274

(22) Filed: Feb. 27, 2017

(65) Prior Publication Data

US 2018/0019152 A1 Jan. 18, 2018

(30) Foreign Application Priority Data

Jul. 13, 2016 (KR) .......................... 10-2016-0088382

(51) Int. Cl.
*H01L 21/683* (2006.01)
*B32B 37/10* (2006.01)
(Continued)

(52) U.S. Cl.
CPC ...... *H01L 21/6836* (2013.01); *B32B 37/1018* (2013.01); *B32B 37/12* (2013.01);
(Continued)

(58) Field of Classification Search
CPC . H01L 21/6836; H01L 21/6838; B32B 37/12; B32B 37/1018
See application file for complete search history.

(56) References Cited

U.S. PATENT DOCUMENTS 4,534,047 A 8/1985 Deschenaux et al.
6,344,402 B1 * 2/2002 Sekiya ............. H01L 21/67092
257/E21.599
(Continued)

FOREIGN PATENT DOCUMENTS

JP 2015-115418 6/2015
KR 1020080013768 2/2008
(Continued)

*Primary Examiner* — Christopher T Schatz
(74) *Attorney, Agent, or Firm* — F. Chau & Associates, LLC

(57) ABSTRACT

An adhesive tape sticking apparatus includes a chamber includes a lower chamber and an upper chamber. The lower chamber includes a first inner space and the upper chamber includes a second inner space. An adhesive tape sheet is positioned between the upper chamber and the lower chamber. A substrate support is movable upward and downward within the lower chamber and is configured to support a substrate. A differential pressure generator is configured to generate a differential pressure between the first inner space and the second inner space. A tape support plate positioned between a first sidewall of the lower chamber and a circumferential edge of the substrate. The tape support plate is configured to contact at least a portion of the adhesive tape sheet when the adhesive tape sheet bends downward toward the first inner space when the differential pressure is generated between the first and second inner spaces.

19 Claims, 16 Drawing Sheets

(51) Int. Cl.
  *B32B 37/12* (2006.01)
  *H01L 21/687* (2006.01)
(52) U.S. Cl.
  CPC .... *H01L 21/6838* (2013.01); *H01L 21/68771* (2013.01); *B32B 2405/00* (2013.01); *B32B 2439/00* (2013.01); *B32B 2457/14* (2013.01)

(56) References Cited

U.S. PATENT DOCUMENTS

| | | | |
|---|---|---|---|
| 6,481,482 B1* | 11/2002 | Shimotomai | B32B 17/06 100/322 |
| 7,896,049 B2 | 3/2011 | Yamamoto | |
| 9,142,441 B2 | 9/2015 | Yamamoto et al. | |
| 9,230,862 B2 | 1/2016 | Yano | |
| 2008/0038903 A1* | 2/2008 | Yamamoto | B24B 37/30 438/464 |
| 2008/0115893 A1* | 5/2008 | Chikaki | H01L 31/18 156/499 |
| 2009/0165957 A1* | 7/2009 | Lee | B32B 37/0046 156/379 |
| 2013/0011225 A1* | 1/2013 | Goodman | H01L 21/67092 414/225.01 |
| 2015/0181684 A1* | 6/2015 | Banna | H05H 1/24 438/710 |
| 2016/0204010 A1 | 7/2016 | Matsuda | |

FOREIGN PATENT DOCUMENTS

| | | |
|---|---|---|
| KR | 1020080080883 | 9/2008 |
| KR | 1020100118558 | 11/2010 |
| KR | 1020130045696 | 5/2013 |
| KR | 1020140029313 | 3/2014 |
| KR | 1020140051784 | 5/2014 |
| KR | 1020160001636 | 1/2016 |
| KR | 1020160014536 | 2/2016 |
| KR | 1020160022834 | 3/2016 |
| WO | 2009081880 | 7/2009 |
| WO | 2014201627 | 12/2014 |

* cited by examiner

ADHESIVE TAPE STICKING APPARATUS AND METHOD OF MANUFACTURING A SEMICONDUCTOR PACKAGE USING THE SAME

CROSS-REFERENCE TO RELATED APPLICATION

This application claims priority under 35 U.S.C. § 119 to Korean Patent Application No. 10-2016-0088382, filed on Jul. 13, 2016 in the Korean Intellectual Property Office (KIPO), the disclosure of which is incorporated by reference herein in its entirety.

1. TECHNICAL FIELD

Exemplary embodiments of the present inventive concept relate to an adhesive tape sticking apparatus, and more particularly to a method of manufacturing a semiconductor package using the same.

2. DISCUSSION OF RELATED ART

After an adhesive tape sheet is attached to an active surface or a backside of a semiconductor wafer, package processes such as a dicing process may be performed on the semiconductor wafer. For example, a deformable sheet known as dicing tape may be attached to a semiconductor wafer, and the dicing tape may be diced into a plurality of dies by a sawing device. The dicing tape may be expanded radially by a tape expanding device, and thus the dies may be separated from each other.

In a vacuum wafer mounting device, an adhesive tape sheet may be stretched toward a wafer using a vacuum pressure and then stuck on a surface of the wafer. In this case, the adhesive tape sheet may be provided from a bobbin winding device. Thus, the stretched portion of the adhesive tape sheet might not return to its original position due to internal residual stress or a tension that may occur when the adhesive tape sheet is stuck on the wafer, and thus wrinkles may be generated in the portions adjacent to the wafer. A heating device may be used to remove the wrinkles through one or more heating processes.

SUMMARY

An exemplary embodiment of the present inventive concept provides an adhesive tape sticking apparatus configured to stick a dicing adhesive tape on a semiconductor wafer without generating wrinkles in the dicing adhesive tape.

An exemplary embodiment of the present inventive concept provides a method of manufacturing a semiconductor package using the adhesive sticking apparatus.

According to an exemplary embodiment of the present inventive concept, an adhesive tape sticking apparatus includes a chamber includes a lower chamber and an upper chamber. The lower chamber includes a first inner space and the upper chamber includes a second inner space. An adhesive tape sheet is positioned between the upper chamber and the lower chamber. A substrate support is movable upward and downward within the lower chamber and is configured to support a substrate. A differential pressure generator is configured to generate a differential pressure between the first inner space and the second inner space. A tape support plate positioned between a first sidewall of the lower chamber and a circumferential edge of the substrate. The tape support plate is configured to contact at least a portion of the adhesive tape sheet when the adhesive tape sheet bends downward toward the first inner space when the differential pressure is generated between the first and second inner spaces.

According to an exemplary embodiment of the present inventive concept, an adhesive tape sticking apparatus includes a lower chamber including a bottom wall and a first sidewall defining a first inner space, and an upper chamber including a top wall and a second sidewall defining a second inner space. A substrate support is movable upward and downward within the lower chamber and is configured to support a substrate. A differential pressure generator is configured to generate a differential pressure between the first inner space and the second inner space when an adhesive tape sheet is disposed between the lower chamber and the upper chamber. A tape support plate extends from an inner surface of an upper portion of the first sidewall toward a circumferential edge of the substrate. The tape support plate is configured to contact at least a portion of the adhesive tape sheet when the adhesive tape sheet bends downward toward the first inner space when the differential pressure is generated between the first and second inner spaces.

According to an exemplary embodiment of the present inventive concept, when the adhesive tape sheet is joined to the wafer, the portion of the adhesive tape sheet between the circumferential edge of the wafer and an inner circumferential edge of an annular ring frame may be prevented from being stretched. Thus, after the adhesive tape sheet is joined to the wafer, wrinkles may be prevented from being generated in the portion of the adhesive tape sheet adjacent to the circumferential edge of the wafer.

Because the portion of the adhesive tape sheet between the circumferential edge of the wafer and the inner circumferential edge of the annular ring frame is prevented from being stretched, an additional heating process for heating the stretched portion to shrink may be omitted, thus simplifying a package manufacturing process.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EMBODIMENTS

Figure 1:
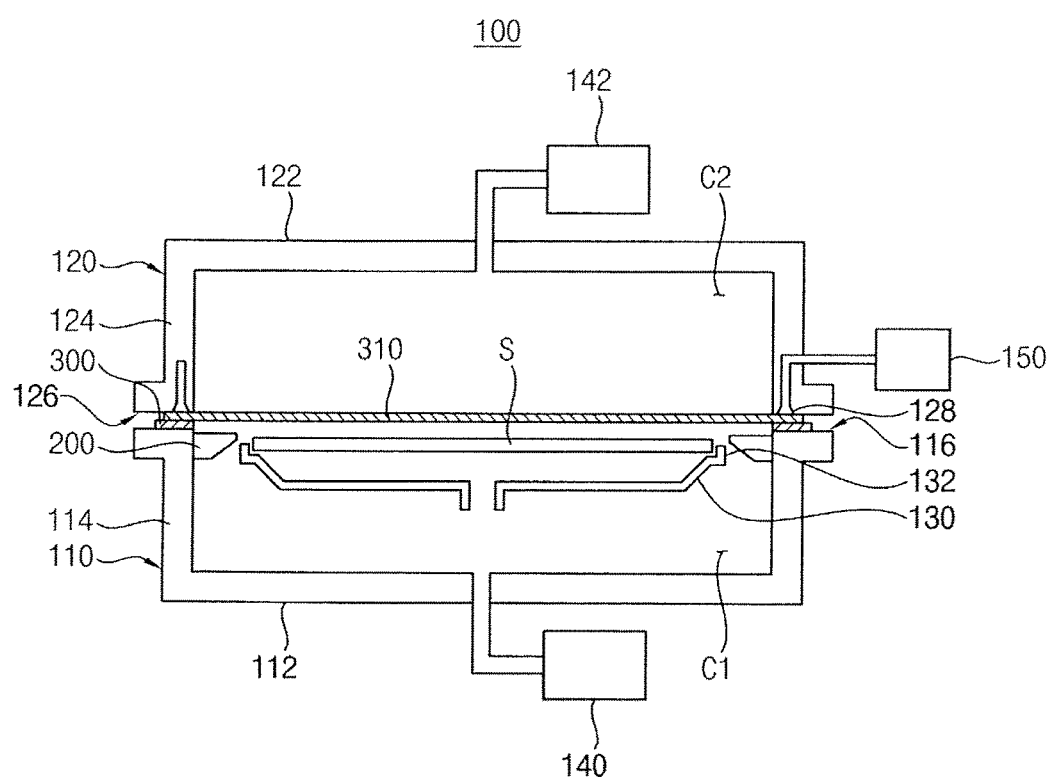
FIG. 1 is a cross-sectional view illustrating an adhesive tape sticking apparatus according to an exemplary embodiment of the present inventive concept.
Figure 2:
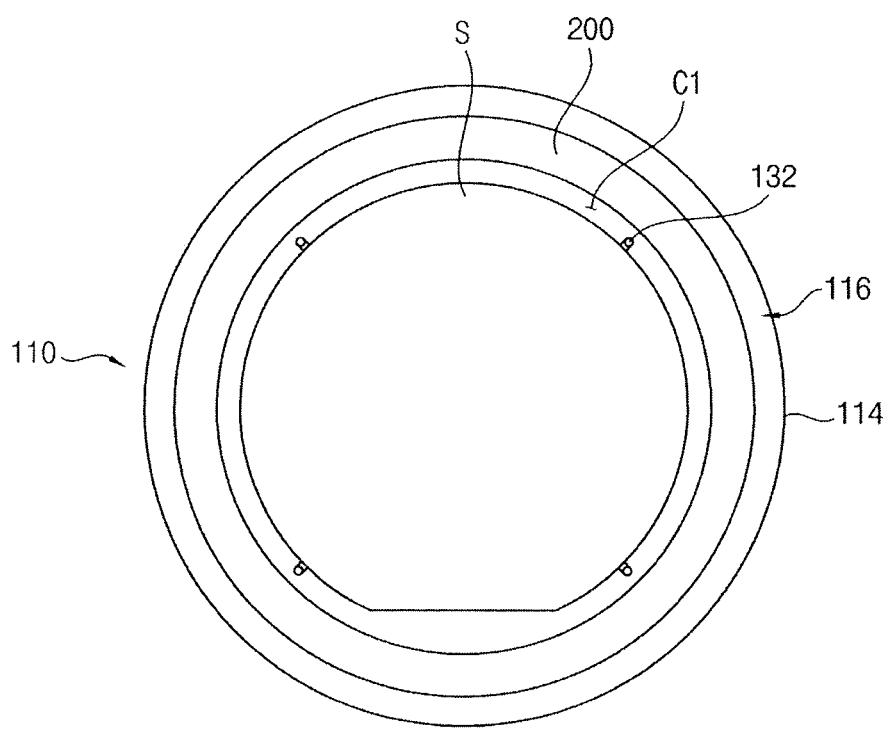
FIG. 2 is a plan view illustrating a lower chamber of the adhesive tape sticking apparatus in FIG. 1.
Figure 3:
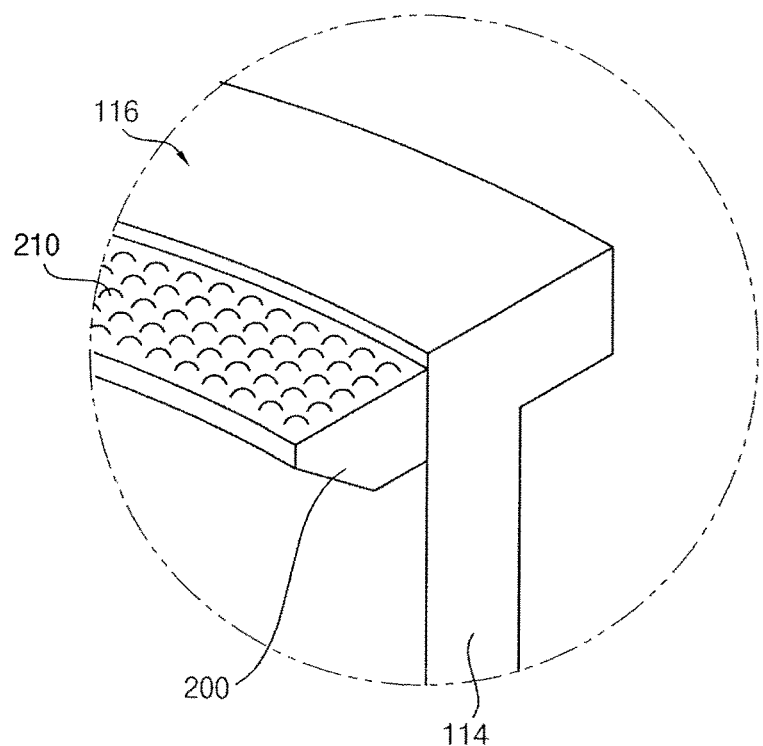
FIG. 3 is a perspective view illustrating a portion of a tape support plate of the adhesive tape sticking apparatus in FIG. 1.
Figure 4:
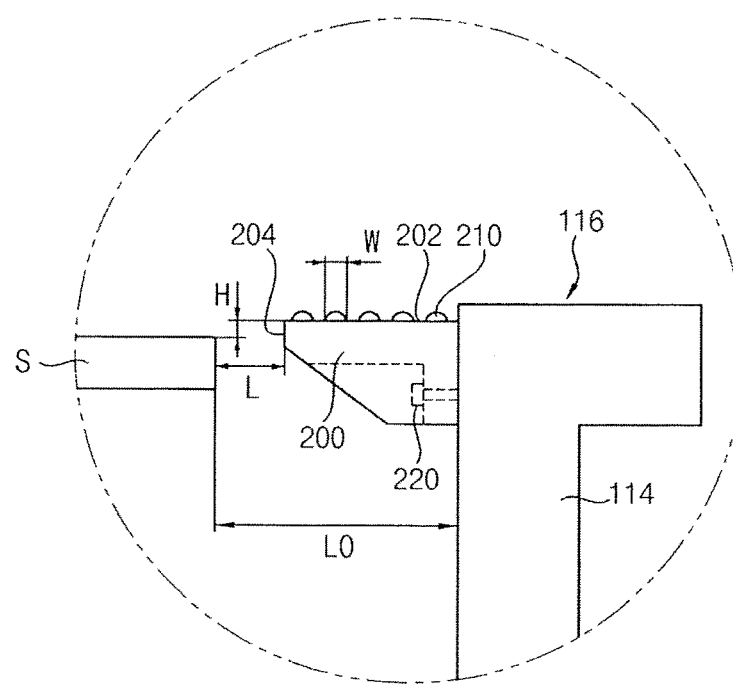
FIG. 4 is a cross-sectional view illustrating the tape support plate in FIG. 3.
Figure 5:
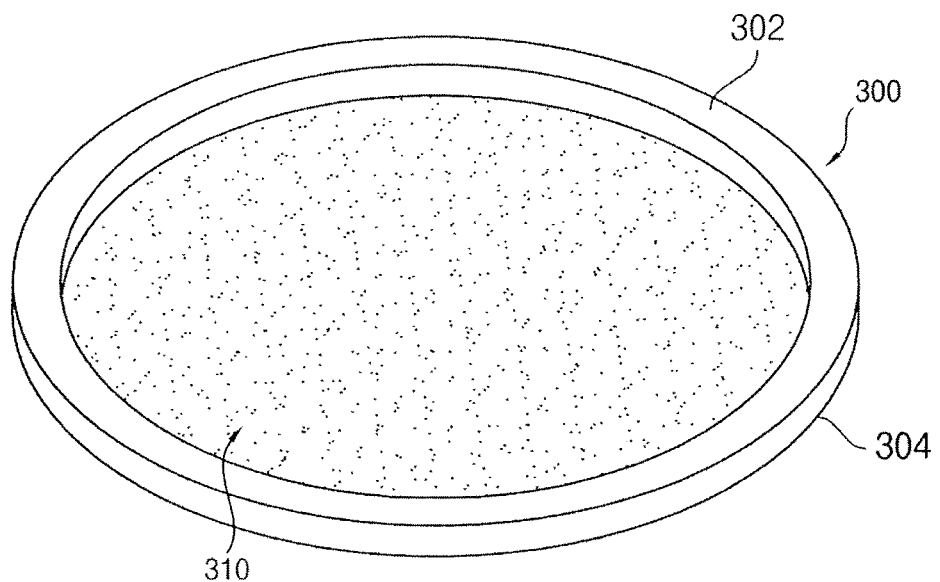
FIG. 5 is a perspective view illustrating a ring frame supported by the adhesive tape sticking apparatus in FIG. 1.
Figure 6:
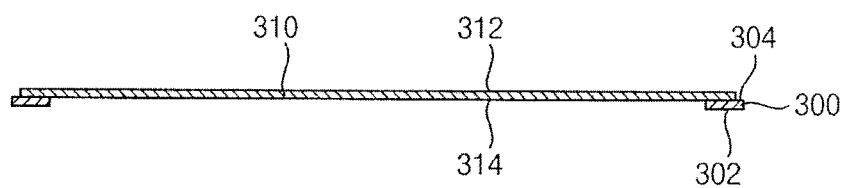
FIG. 6 is a cross-sectional view illustrating the ring frame in FIG. 5.

FIG. 1 is a cross-sectional view illustrating an adhesive tape sticking apparatus according to an exemplary embodiment of the present inventive concept. FIG. 2 is a plan view illustrating a lower chamber of the adhesive tape sticking apparatus in FIG. 1. FIG. 3 is a perspective view illustrating a portion of a tape support plate of the adhesive tape sticking apparatus in FIG. 1. FIG. 4 is a cross-sectional view illustrating the tape support plate in FIG. 3. FIG. 5 is a perspective view illustrating a ring frame supported by the adhesive tape sticking apparatus in FIG. 1. FIG. 6 is a cross-sectional view illustrating the ring frame in FIG. 5.

Referring to FIGS. 1 to 6, an adhesive tape sticking apparatus 100 may include a chamber having a lower chamber 110 and an upper chamber 120. The upper chamber 120 and the lower chamber 110 may be coupled to each other to form an airtight seal. A substrate support 130 within the lower chamber 110 may be configured to support a substrate S such as a wafer. A differential pressure generator may be in communication with at least one of the lower chamber 110 and the upper chamber 120 to selectively create a vacuum. A tape support plate 200 may be disposed on an upper sidewall of the lower chamber 110. The tape support plate 200 may surround the substrate S.

According to an exemplary embodiment of the present inventive concept, the adhesive tape sticking apparatus 100 may be a wafer mount apparatus capable of joining the substrate S such as a wafer to a ring frame 300 through an adhesive tape sheet 310. As an example, the adhesive tape sheet may be a dicing adhesive tape. Thus, the ring frame 300 may hold the substrate S. The substrate S may be a single wafer or a plurality of wafers stacked on each other. For example, the stacked wafers may be electrically connected to one another by through plugs such as TSVs (through silicon vias).

The substrate S may have a first surface and a second surface opposite to each other. Any one of the first and second surfaces may be a backside of the wafer on which a circuit pattern and a plurality of bumps are formed. As described in more detail below, after the substrate is diced into individual chips, each of the individual chips may be mounted on a package substrate through the bumps to form a 3D (3-dimensional) semiconductor package.

The lower chamber 110 may include a bottom wall 112 and a first sidewall 114 defining a first inner space C1. Referring to FIG. 2, the first sidewall 114 may have a cylindrical shape. The upper chamber 120 may include a top wall 122 and a second sidewall 124 defining a second inner space C2. The second sidewall 124 may have a cylindrical shape corresponding to a shape of the first sidewall 114.

The substrate support 130 may be movable upward and downward within the lower chamber 110. The substrate support 130 may include a support frame. The support frame may move upward and downward within the lower chamber, and may be coupled to the bottom wall 112 of the lower chamber 110. The substrate support 130 may include a plurality of protruding portions 132 extending upward from the support frame to contact and support a circumferential surface of the substrate S. For example, the substrate support 130 may include four protruding portions 132; however example embodiments of the present inventive concept are not limited thereto. Thus, a space under the substrate S supported by the protruding portions 132 may be positioned in the first inner space C1. The support frame may be movable upward and downward by a linear motor.

The first sidewall 114 may have an upper edge 116, and the second sidewall 124 may have a lower edge 126 in a position corresponding to the upper edge 116. The lower chamber 110 and the upper chamber 120 may be coupled to each other to form a continuous airtight space including the upper chamber 120 and the lower chamber 110. An o-ring may be disposed on at least one of the upper edge 116 and the lower edge 126.

The lower chamber 110 and the upper chamber 120 may move relative to each other (e.g., in downward and upward directions, respectively). For example, the upper chamber 120 may be supported to move along a vertical rail extending in a vertical direction by a linear motor. The upper chamber 120 may move upward by the linear motor to open the chamber and may move downward to engage with the lower chamber 110 to close the chamber and to form the continuous airtight space including the upper chamber 120 and the lower chamber 110.

The adhesive tape sheet 310 may be held in place between the lower chamber 110 and the upper chamber 120. Referring to FIGS. 5 and 6, the adhesive tape sheet 310 may have a tacky surface 314 and a non-tacky surface 312 opposite to each other. A peripheral portion of the tacky surface 314 of the adhesive tape sheet 310 may be attached to a top surface 304 of the ring frame opposite a bottom surface 302 of the ring frame 300. For example, the adhesive tape sheet 310 may be attached to the ring frame 300, and the ring frame 300 may be held in position between the upper edge 116 of the lower chamber 110 and the lower edge 126 of the upper chamber 120 such that the adhesive tape sheet 310 may be clamped between the lower chamber 110 and the upper chamber 120.

When the adhesive tape sheet 310 is clamped between the lower chamber 110 and the upper chamber 120, the first inner space C1 may be formed within the lower chamber 110 and the second inner space C2 may be formed within the upper chamber 120 by the adhesive tape sheet 310.

A differential pressure generator may generate a differential pressure between the first inner space C1 and the second inner space C2. For example, the differential pressure generator may include a first vacuum device 140 connected to the lower chamber 110 to selectively create a vacuum within the first inner space C1 and a second vacuum device 142 connected to the upper chamber 120 to selectively create a vacuum within the second inner space C2.

The first vacuum device 140 may be in communication with the lower chamber 110 through a first vacuum line. The first vacuum device 140 may include a first vacuum source connected to the first vacuum line and a first electromagnetic valve positioned in the first vacuum line. For example, the first electromagnetic valve may be a 3 way solenoid valve. The 3 way solenoid valve may selectively connect the first vacuum line to a pipe connected to a vacuum pump, for example, the vacuum source, or to a pipe for introducing an atmospheric pressure.

The second vacuum device 142 may be in communication with the upper chamber 120 through a second vacuum line. The second vacuum device 142 may include a second vacuum source connected to the second vacuum line and a second electromagnetic valve positioned in the second vacuum line. For example, the second electromagnetic valve may be a 3 way solenoid valve. The 3 way solenoid valve may selectively connect the second vacuum line to a pipe connected to a vacuum pump, for example, the vacuum source, or to a pipe for introducing an atmospheric pressure.

A controller may open and close the first and second electromagnetic valves, and may operate the vacuum sources.

When the adhesive tape sheet 310 is clamped between the lower chamber 110 and the upper chamber 120, the first vacuum device 140 may create a vacuum within the first inner space C1 and the second vacuum device 142 may create a vacuum within the second inner space C2. The second vacuum device 142 may introduce an atmospheric pressure to the second inner space C2 to generate a differential pressure between the first inner space C1 and the second inner space C2. As an example, a pressure within the second inner space C2 may be greater than a pressure within the first inner space C1. The differential pressure may cause the adhesive tape sheet 310 to cave and bend (e.g., in a downward direction) such that the adhesive tape sheet 310 may first contact a substantially central portion of the substrate S and may then gradually contact the substrate S from the center of the substrate S toward a periphery edge of the substrate S.

Alternatively, the differential pressure generate may include only the first vacuum device 140. When the adhesive tape sheet 310 is clamped between the lower chamber 110 and the upper chamber 120, the first vacuum device 140 may create a vacuum within the first inner space C1 so that a pressure within the second inner space C2 may be relatively greater than a pressure within the first inner space C1. The differential pressure may cause the adhesive tape sheet 310 to cave and bend downward such that the adhesive tape sheet 310 may be attached to the substrate S, as described above.

According to an exemplary embodiment of the present inventive concept, the tape support plate 200 may be positioned between an upper portion of the first sidewall 114 of the lower chamber 110 and a circumferential edge of the substrate S. The tape support plate 200 may extend from an inner surface of the upper portion of the first sidewall 114 toward the circumferential edge of the substrate S by a predetermined distance. The tape support plate 200 may contact and support at least a portion of the adhesive tape sheet 310 that caves and bends downward.

The tape support plate 200 may include a mask ring having an annular shape (e.g., a ring shape). The mask ring may be detachably connected to the first sidewall 114 of the lower chamber 110. For example, the tape support plate 200 may be connected to the inner surface of the first sidewall 114 of the lower chamber 110 by a fastening bolt 220. The tape support plate 200 may include a metal such as stainless steel or plastic.

As an example, a distance L0 between the first sidewall 114 of the lower chamber 110 and the circumferential edge of the substrate S may be from about 20 mm to about 30 mm, and a width of the mask ring may be from about 15 mm to about 25 mm.

An inner surface 204 of the tape support plate 200 may be spaced apart from the circumferential edge of the substrate S by a predetermined distance L. A distance between the inner surface 204 of the tape support plate 200 and the circumferential edge of the substrate S may be from about 1 mm to about 6 mm.

An upper surface 202 of the tape support plate 200 may be disposed at substantially a same height as an upper surface of the substrate, or may be higher than the upper surface of the substrate S. For example, the upper surface 202 of the tape support plate 200 may be positioned to be higher than the upper surface of the substrate S by a predetermined height H. For example, the upper surface 202 of the tape support plate 200 may be positioned to be higher than the upper surface of the substrate S by from about 0.1 mm to about 1 mm.

The tape support plate 200 may slidably move along the first sidewall 114 by a height adjusting screw. Thus, the height of the upper surface 202 of the tape support plate 200 may be adjusted by the height adjusting screw.

The tape support plate 200 may include a plurality of protrusions 210 projecting from the upper surface 202 of the tape support plate 200. As an example, a diameter W of each of the protrusions 210 may be from about 100 μm to about 1000 μm. Alternatively, the tape support plate 200 may include a plurality of dimples or recesses in the upper surface 202 of the tape support plate 200.

The protrusions 210 or dimples may increase surface roughness of the upper surface 202 of the tape support plate 200, thus reducing a contact area of the adhesive tape sheet 310 with the tape support plate 200. Thus, the adhesive tape sheet 310 may be easily removed from the tape support plate 200.

The width of the tape support plate 200 may be determined in consideration of the distance between the first sidewall 114 and the substrate S, and the number or the diameter of the protrusions or the dimples may be determined in consideration of the width of the tape support plate 200 and the distance from the substrate S.

According to an exemplary embodiment of the present inventive concept, the adhesive tape sticking apparatus 100 may include a ring frame holder configured to hold the ring frame 300 having the adhesive tape sheet 310 adhered thereto.

For example, the ring frame holder may include a suction pad 128 positioned in the lower edge 126 of the second sidewall 124. The suction pad 128 may be connected to a vacuum suction device 150. The suction pad 128 may be positioned in the engagement surface of the second sidewall 124 to suction-hold the ring frame 300.

The adhesive tape sticking apparatus 100 may include the tape support plate 200 positioned between the inner surface of the upper portion of the first sidewall 114 and the circumferential edge of the substrate S. The tape support plate 200 may contact and support at least the portion of the adhesive tape sheet 310 that bends downward from the first sidewall 114 by the differential pressure between the lower chamber 110 and the upper chamber 120.

Thus, when the adhesive tape sheet 310 is joined to the substrate S (e.g., a wafer), a portion of the adhesive tape sheet 310 between the circumferential edge of the substrate S and an inner circumferential edge of the annular ring frame 300 may be prevented from being stretched. Thus, after the adhesive tape sheet 310 is joined to the substrate S, a generation of wrinkles may be reduced or prevented in the portion of the adhesive tape sheet 310 adjacent to the circumferential edge of the substrate S. Additionally, an area of the stretched adhesive tape sheet 310 around the substrate S may be minimized to prevent wrinkles from being generated after a wafer mounting process.

Since the portion of the adhesive tape sheet 310 between the circumferential edge of the substrate S and the inner circumferential edge of the annular ring frame 300 is prevented from being stretched, an additional heating process for heating the stretched portion to shrink may be omitted, and thus a package manufacturing process may be simplified.

Figure 7:
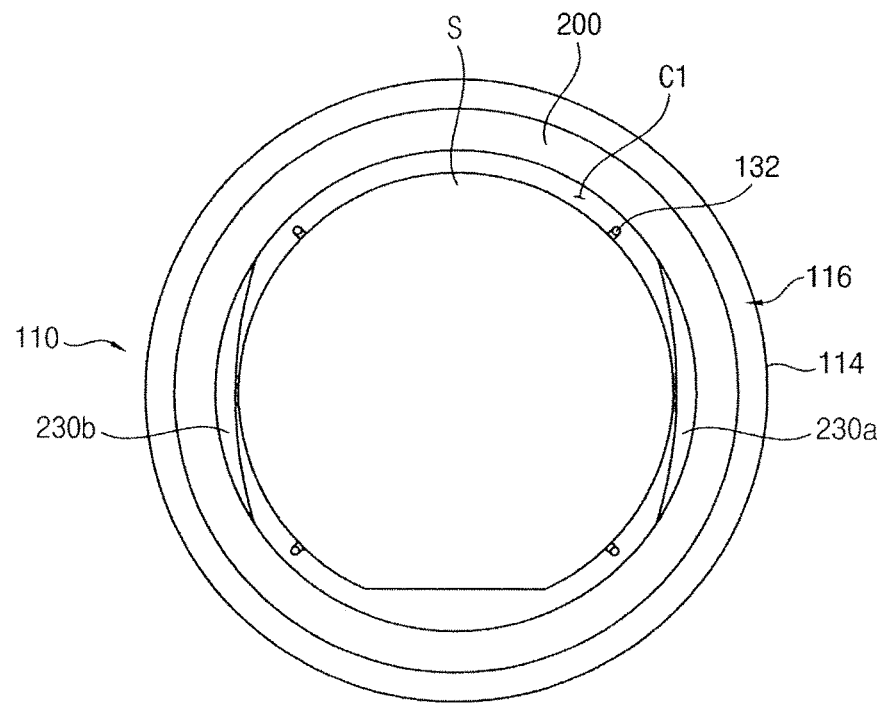
FIG. 7 is a plan view illustrating a lower chamber of an adhesive tape sticking apparatus according to an exemplary embodiment of the present inventive concept.
Figure 8:
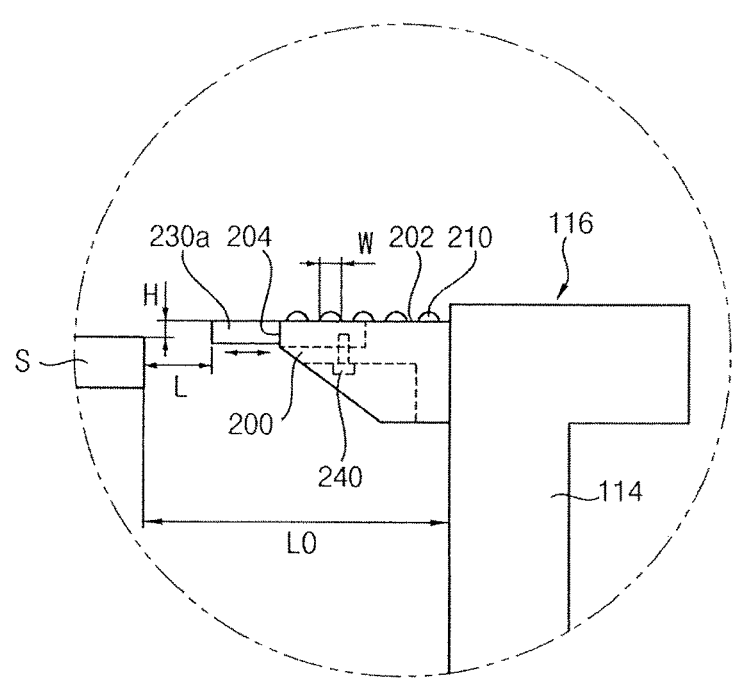
FIG. 8 is a cross-sectional view illustrating a tape support plate in FIG. 7.

FIG. 7 is a plan view illustrating a lower chamber of an adhesive tape sticking apparatus according to an exemplary embodiment of the present inventive concept. FIG. 8 is a cross-sectional view illustrating a tape support plate in FIG. 7. The adhesive tape sticking apparatus described with reference to FIGS. 7 and 8 may be substantially the same as or similar to the adhesive tape sticking as described with reference to FIGS. 1 to 4, except for an addition of an auxiliary plate. Thus, the same reference numerals may be used to refer to the same or like elements and duplicative descriptions may be omitted.

Referring to FIGS. 7 and 8, an adhesive tape sticking apparatus according to an exemplary embodiment of the present inventive concept may include an auxiliary plate which extends from the inner surface of the tape support plate 200 toward a circumferential edge of the substrate S. The auxiliary plate may include a first auxiliary ring 230a and a second auxiliary ring 230b disposed on opposite sides of the substrate S.

The first auxiliary ring 230a may be extendable along a direction from the tape support plate 200 to the circumferential edge of the substrate S. The first auxiliary ring 230a may slidably move along a guide recess formed in the tape support plate 200 by a forward/backward adjusting screw 240. Similarly to the first auxiliary ring 230a, the second auxiliary ring 230b may be extendable along a direction from the tape support plate 200 to the circumferential edge of the substrate S.

Portions of the adhesive tape sheet 310 at 3 o'clock and 6 o'clock positions with respect to the substrate S may be contacted and supported by the tape support plate 200 and the first and second auxiliary rings 230a and 230b. Thus, portions of the adhesive tape sheet 310 having internal residual stress in a specific direction due to a roll winding device may be supported by the tape support plate 200 and the first and second auxiliary rings 230a and 230b, which may reduce or prevent wrinkles from being generated in the adhesive tape sheet 310. A stretched area or a degree of stretching of the adhesive tape sheet 310 beyond the circumferential edge of the substrate S may be reduced by the tape support plate 200 and the first and second auxiliary rings 230a and 230b, which may reduce or prevent wrinkles from being generated in the adhesive tape sheet 310 (e.g., in the area of the adhesive tape sheet beyond the circumferential edge of the substrate S) during or after a wafer mounting process.

Figure 9:
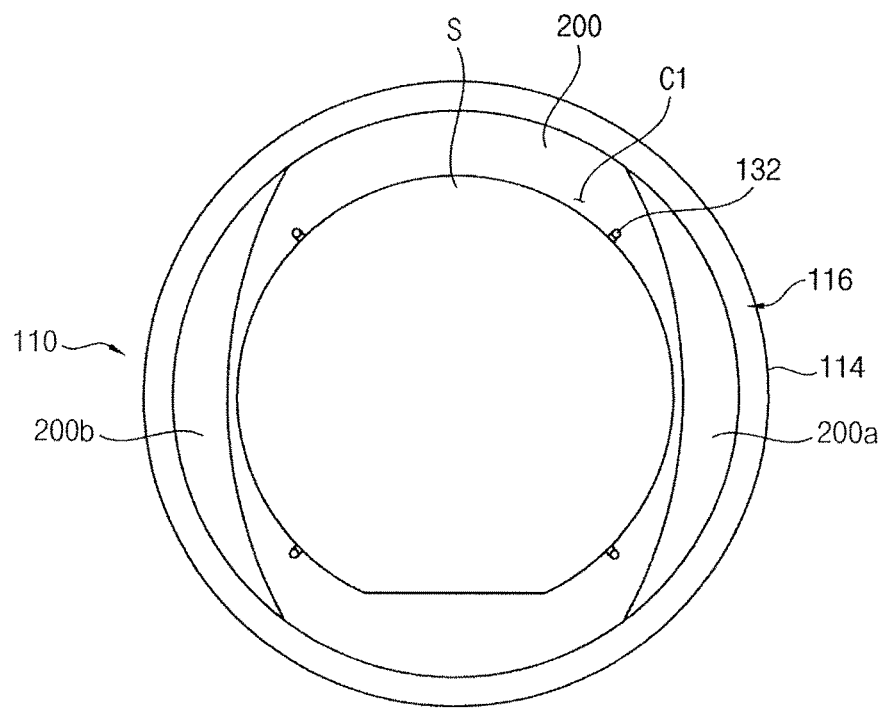
FIG. 9 is a plan view illustrating a lower chamber of an adhesive tape sticking apparatus according to an exemplary embodiment of the present inventive concept.

FIG. 9 is a plan view illustrating a lower chamber of an adhesive tape sticking apparatus according to an exemplary embodiment of the present inventive concept. The adhesive tape sticking apparatus described with reference to FIG. 9 may be substantially the same as or similar to the adhesive tape sticking as described with reference to FIGS. 1 to 4, except for a configuration of a tape support plate. Thus, the same reference numerals may be used to refer to the same or like elements and duplicative descriptions may be omitted.

Referring to FIG. 9, a tape support plate of an adhesive tape sticking apparatus may include a first mask wing 200a and a second mask wing 200b disposed on opposite sides of the substrate S. The first mask wing 200a may be arranged at a 3 o'clock position with respect to the substrate S and the second mask wing 200b may be arranged at a 6 o'clock position with respect to the substrate S.

The first mask wing 200a and the second mask wing 200b may have a crescent or fan shape. The first mask wing 200a may cover a portion a first side of the substrate S between the first side wall 114 of the lower chamber 110 and a circumferential edge of the substrate S, and the second mask wing 200b may cover a portion of a second side of the substrate S opposite the first side of the substrate S between the first side wall 114 of the lower chamber 110 and the circumferential edge of the substrate S.

The first and second mask wings 200a and 200b may contact and support portions of the adhesive tape sheet 310 at 3 o'clock and 6 o'clock positions with respect to the substrate S. Thus, the portions of the adhesive tape sheet 310 having internal residual stress in a specific direction may be supported by the first and second mask wings 200a and 200b, which may reduce or prevent wrinkles from being generated in the adhesive tape sheet 310.

Figure 10:
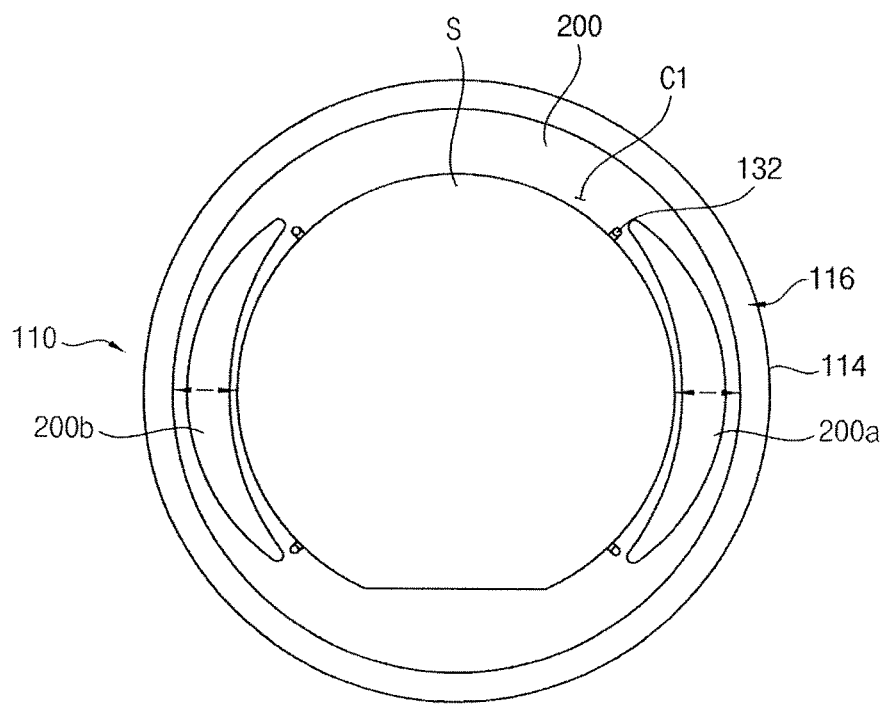
FIG. 10 is a plan view illustrating a lower chamber of an adhesive tape sticking apparatus according to an exemplary embodiment of the present inventive concept.

FIG. 10 is a plan view illustrating a lower chamber of an adhesive tape sticking apparatus according to an exemplary embodiment of the present inventive concept. The adhesive tape sticking apparatus described with reference to FIG. 10 may be substantially the same as or similar to the adhesive tape sticking apparatus described with reference to FIGS. 1 to 4, except for a configuration of a tape support plate. Thus, the same reference numerals may be used to refer to the same or like elements and duplicative descriptions may be omitted.

Referring to FIG. 10, a tape support plate of an adhesive tape sticking apparatus may include a first mask wing 200a and a second mask wing 200b disposed on opposite sides of the substrate S. The first mask wing 200a may be arranged at a 3 o'clock position with respect to the substrate S and the second mask wing 200b may be arranged at a 6 o'clock position with respect to the substrate S.

The first mask wing 200a may be movable along a direction from the first sidewall 114 of the lower chamber 110 to a circumferential edge of a substrate S. The second mask wing 200b may be movable along a direction from the first sidewall 114 of the lower chamber 110 to the circumferential edge of a substrate S.

Sizes (e.g., widths along a direction that is substantially perpendicular to a top surface of the substrate S) of the first and second mask wings 200a and 200b may be controlled. For example, the first and second mask wings 200a and 200b may include a plurality of slidably movable telescopic plates.

The first mask wing 200a and the second mask wing 200b may each have a crescent shape. The first mask wing 200a may cover a portion of a first side of the substrate S between the first side wall 114 of the lower chamber 110 and the circumferential edge of the substrate S, and the second mask wing 200b may cover a portion of a second side of the substrate S opposite the first side between the first side wall 114 of the lower chamber 110 and the circumferential edge of the substrate S.

The first and second mask wings 200a and 200b may contact and support portions of an adhesive tape sheet 310 at 3 o'clock and 6 o'clock positions with respect to the substrate S. Thus, the portions of the adhesive tape sheet 310 having internal residual stress in a specific direction may be supported by the first and second mask wings 200a and 200b, which may reduce or prevent wrinkles from being generated in the adhesive tape sheet 310.

Figure 11:
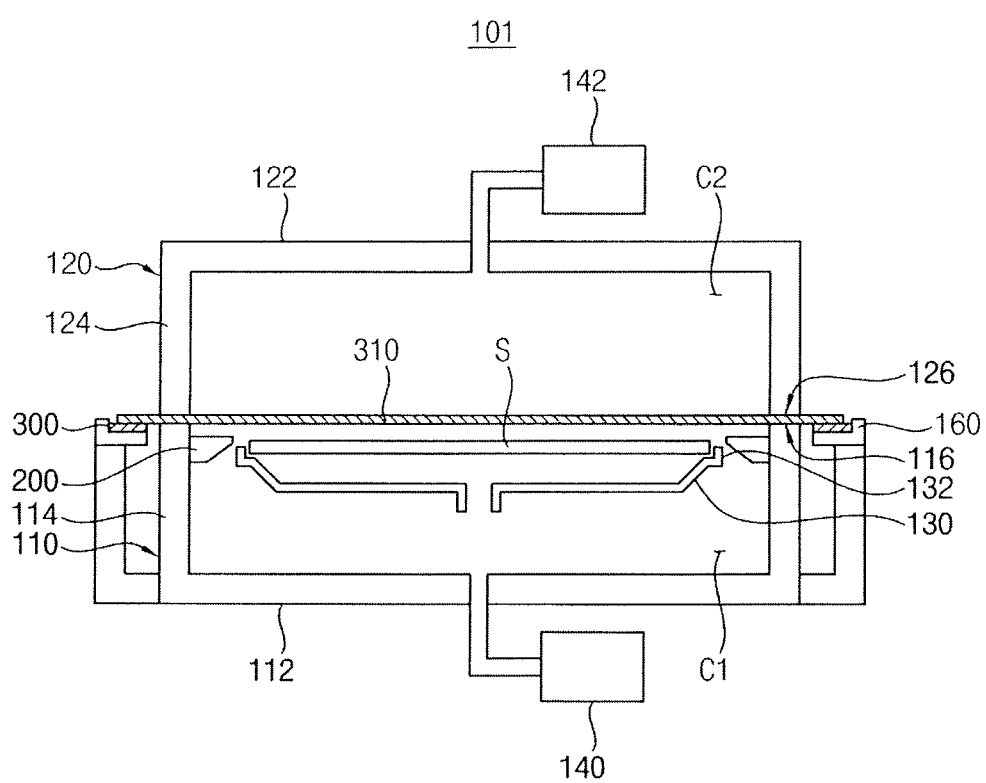
FIG. 11 is a cross-sectional view illustrating an adhesive tape sticking apparatus according to an exemplary embodiment of the present inventive concept.

FIG. 11 is a cross-sectional view illustrating an adhesive tape sticking apparatus according to an exemplary embodiment of the present inventive concept. The adhesive tape sticking apparatus described with reference to FIG. 11 may be substantially the same as or similar to the adhesive tape sticking apparatus described with reference to FIGS. 1 to 4, except for a configuration of a ring frame holder. Thus, the same reference numerals may be used to refer to the same or like elements and duplicative descriptions may be omitted.

Referring to FIG. 11, an adhesive tape sticking apparatus 101 may include a ring frame support table 160 configured to support the ring frame 300 having the adhesive tape sheet 310 attached thereto.

The ring frame support table 160 may have an annular shape (e.g., a ring shape) surrounding the lower chamber 110. An outer diameter of the lower chamber 100 may be smaller than an inner diameter of the ring frame support table 160. When the ring frame 300 is positioned on the ring frame support table 160, a height of the ring frame support table 160 may be adjusted such that the upper edge 116 of the lower chamber 110 is disposed at substantially a same level as an upper surface of the ring frame 300.

A method of manufacturing a semiconductor package using the adhesive tape sticking apparatus according to one or more exemplary embodiments of the present inventive concept will be described below in more detail.

Figure 12:
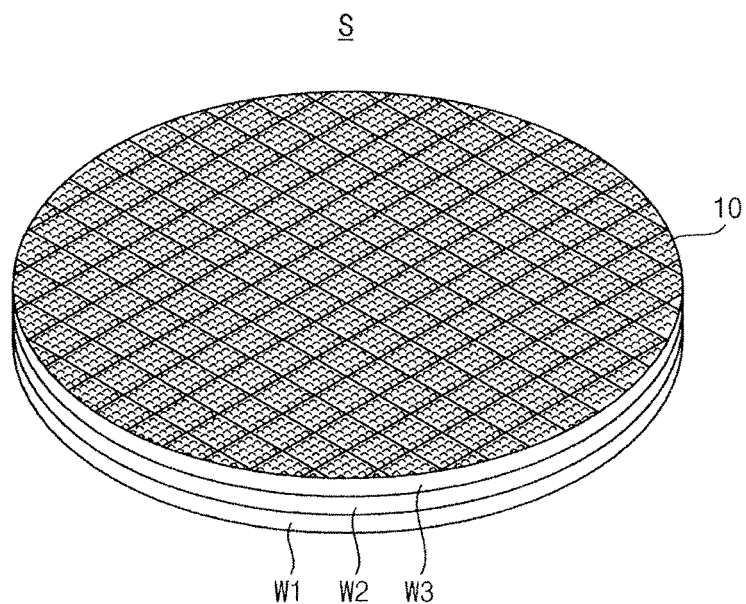
FIG. 12 is a perspective view illustrating a substrate having stacked wafers.
Figure 13:
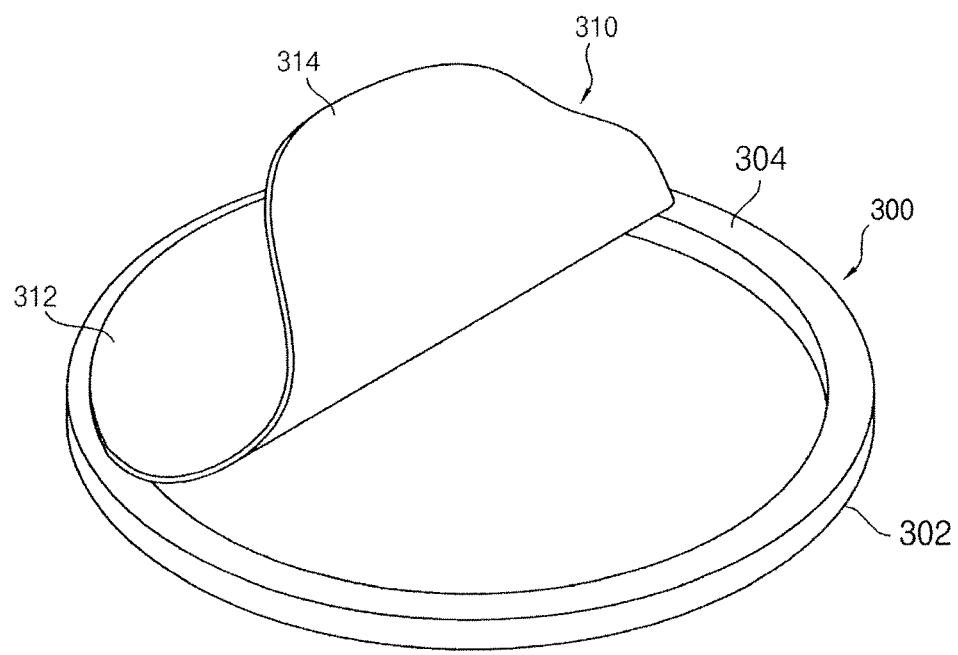
FIG. 13 is a perspective view illustrating an adhesive tape sheet adhered to a ring frame.
Figure 18:
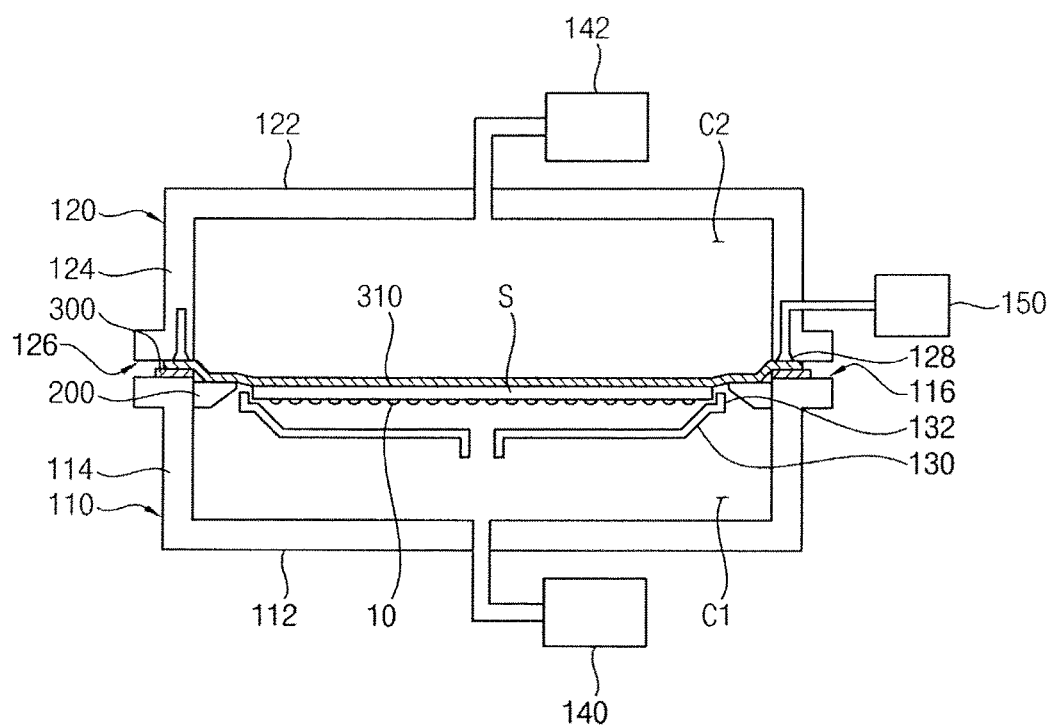
Figure 19:
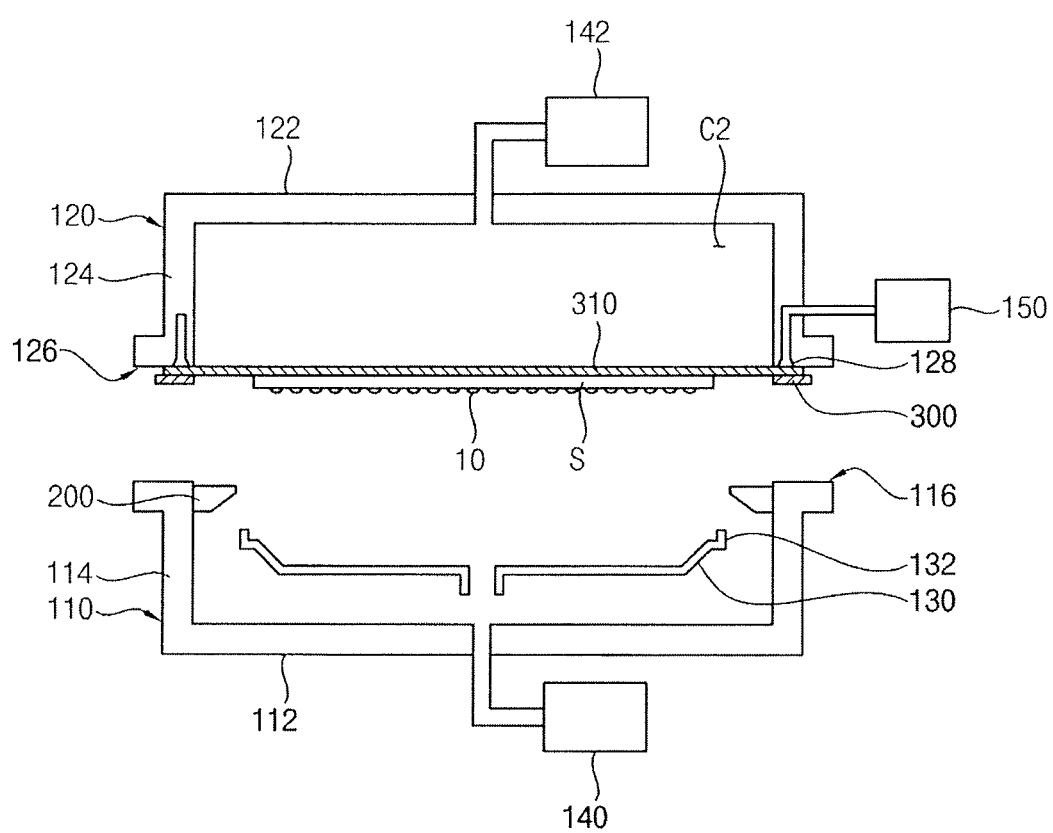
Figure 20:
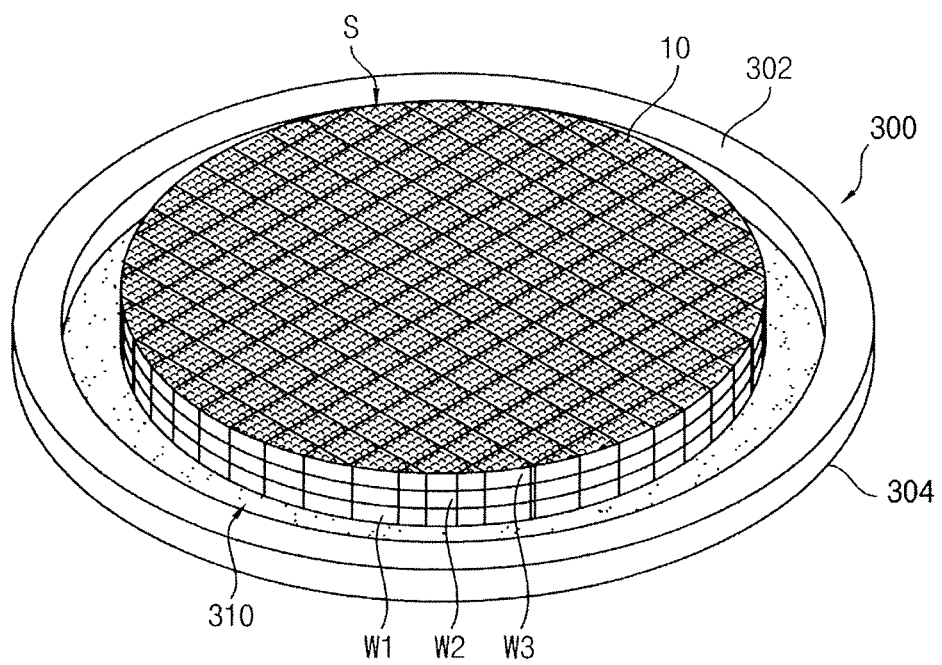
FIG. 20 is a view illustrating the substrate stuck with the adhesive tape sheet of FIG. 13 by the adhesive tape sticking apparatus according to an exemplary embodiment of the present inventive concept.
Figure 21:
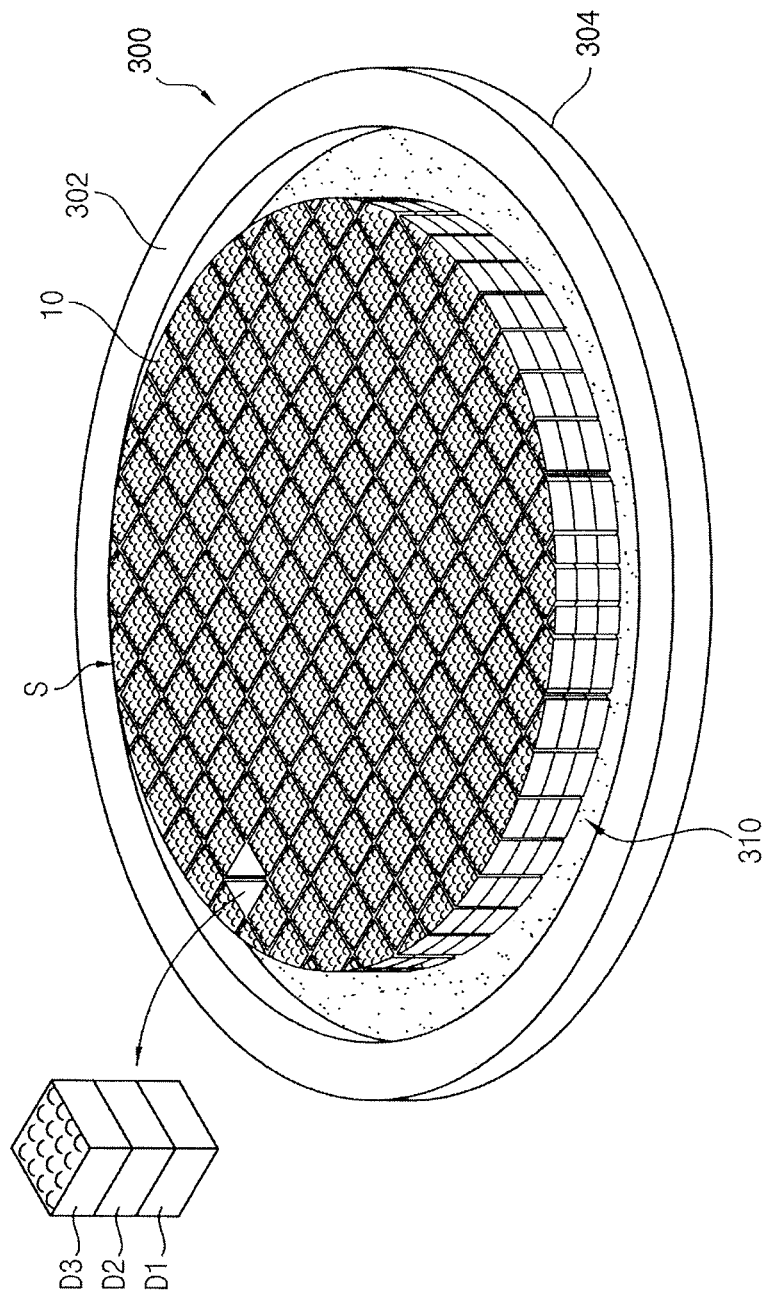
FIG. 21 is a perspective view illustrating dies separated by a tape expanding device.

FIGS. 12 to 21 are views illustrating a method of manufacturing a semiconductor package according to an exemplary embodiment of the present inventive concept. FIG. 12 is a perspective view illustrating a substrate having stacked wafers. FIG. 13 is a perspective view illustrating an adhesive tape sheet adhered to a ring frame. FIGS. 14 to 19 are cross-sectional views illustrating a process of sticking an adhesive tape sheet to a substrate according to an exemplary embodiment of the present inventive concept. FIG. 20 is a view illustrating the substrate stuck with the adhesive tape sheet of FIG. 13 by the adhesive tape sticking apparatus according to an exemplary embodiment of the present inventive concept. FIG. 21 is a perspective view illustrating dies separated by a tape expanding device.

Referring to FIG. 12, first, manufacturing a high bandwidth memory (HBM) device may include forming a substrate structure S including a plurality of stacked wafers. As an example, wafers W1, W2 and W3 may be stacked on one another.

For example, the first, second and third wafers W1, W2 and W3 may be sequentially stacked to form the substrate S. The first, second and third wafers W1, W2 and W3 may be electrically connected to each other by through electrodes such as through silicon vias (TSVs). The first, second and third wafers W1, W2 and W3 may be adhered to each other by an adhesive film, and a molding member may cover the first, second and third wafers W1, W2 and W3 such that a backside of the third wafer W3 is exposed.

The substrate S may have a first surface and a second surface opposite to each other. The first surface may be an active surface of the substrate S and the second surface may be a backside of the substrate S. A circuit pattern and a plurality of bumps 10 may be formed on the second surface of the substrate S. In this case, the backside of the third wafer W3 may be the backside of the substrate S.

Each of the wafers may have a plurality of chip regions and scribe lane regions. The chip region may be a die region in which chips are formed, and the scribe lane region may be a cutting region on which a sawing process is performed to cut the wafer into dice. The chip may include, for example, a logic device, or a memory device and various patterns may be formed therein. The wafer 200 may include a semiconductor material, for example, silicon, germanium, or group III-V compound semiconductor materials, for example, GaP, GaAs, or GaSb. According to an exemplary embodiment of the present inventive concept, the wafer 200 may be a silicon-on-insulator (SOI) substrate or a germanium-on-insulator (GOI) substrate.

Referring to FIG. 13, the adhesive tape sheet 310 may be attached to the ring frame 300.

The ring frame 300 may have an annular shape (e.g., a ring shape). The adhesive tape sheet 300 may be a dicing adhesive tape having a circular shape. The ring frame 300 may have the bottom surface 302 and the top surface 304 opposite to each other, and the adhesive tape sheet 310 may have the tacky surface 314 and the non-tacky surface 312 opposite to each other.

A peripheral portion of the tacky surface 314 of the adhesive tape sheet 310 may be attached to the top surface 304 of the ring frame 300. The ring frame 300 may be a carrier frame which holds and transfers the adhesive tape sheet 310 to the adhesive tape sticking apparatus 100 and supports the substrate while following substrate processing processes are performed.

Figure 14:
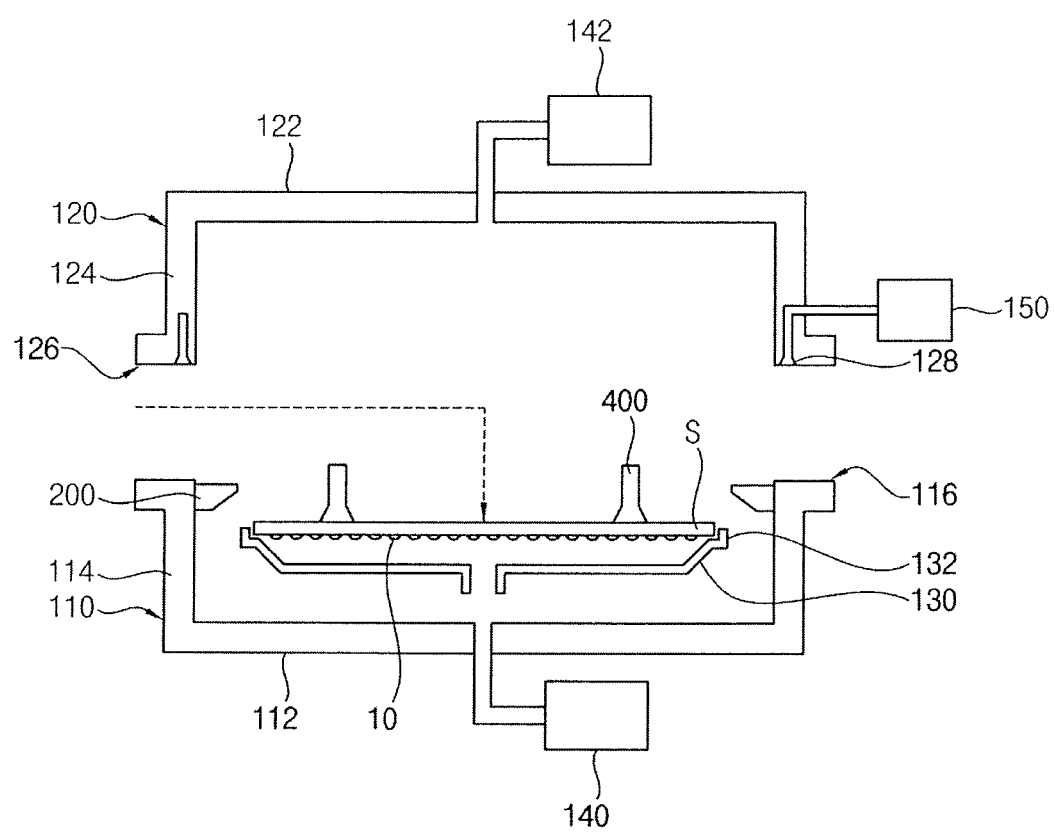
FIGS. 14 to 19 are cross-sectional views illustrating a process of sticking an adhesive tape sheet to a substrate according to an exemplary embodiment of the present inventive concept.

Referring to FIG. 14, the substrate S may be loaded into a chamber of the adhesive tape sticking apparatus 100.

The upper chamber 120 may move upward (e.g., by a linear motor) to open the chamber, a substrate holder 400 of a substrate transfer mechanism may suction the first surface of the substrate S and places the substrate S on protruding portions 132 of the substrate support 130 within the lower chamber 110. Thus, the substrate S may be loaded onto the substrate support 130, and the first surface of the substrate S may be exposed upward.

Figure 15:
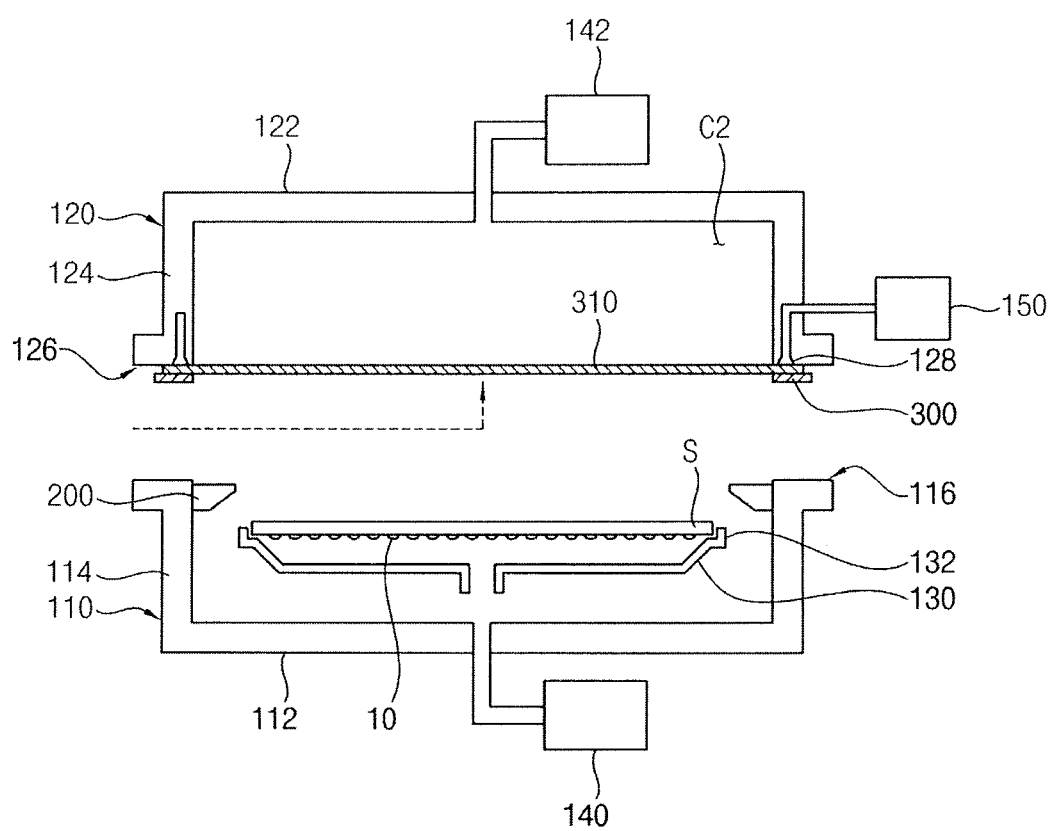

Referring to FIG. 15, the ring frame 300 with the adhesive tape sheet 310 attached thereto may be transferred to a ring frame holder of the adhesive tape sticking apparatus 100.

A suction plate of a ring frame transfer mechanism may suction the bottom surface 302 of the ring frame 300 and transfer to the ring frame 300 to the lower edge 126 of the upper chamber 120. The suction pad 128 positioned in the lower edge 126 of the upper chamber 120 may suction-hold the adhesive tape sheet 310 and the ring frame 300.

Figure 16:
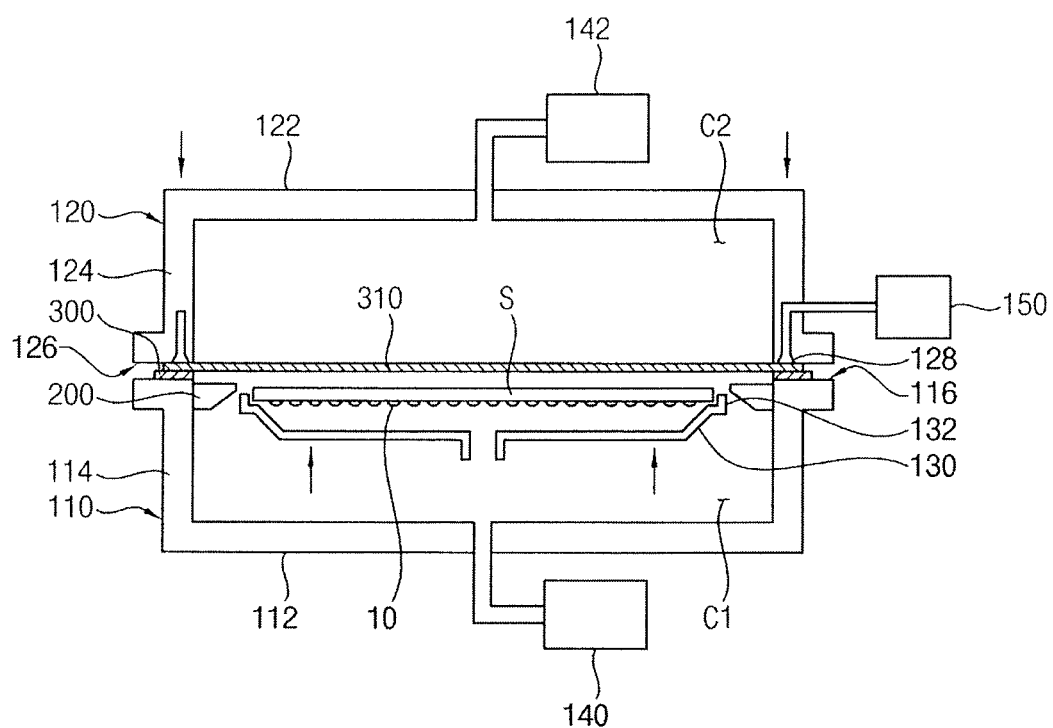

Referring to FIG. 16, the upper chamber 120 may move downward to engage with the lower chamber 110, the substrate support 130 may move upward to position the substrate S to a tape sheet sticking position, and then a vacuum may be created within the chamber.

As an example, the upper chamber 120 may travel downward and engage with the lower chamber 110 to form an airtight seal. Thus, the ring frame 300 with the adhesive tape sheet 310 attached thereto may be retained between the upper edge 116 of the lower chamber 110 and the lower edge 126 of the upper chamber 120 such that the adhesive tape sheet 310 may be clamped between the lower chamber 110 and the upper chamber 120.

When the adhesive tape sheet 310 is clamped between the lower chamber 110 and the upper chamber 120, the first inner space C1 may be formed within the lower chamber 110 and the second inner space C2 may be formed within the upper chamber 120 by the adhesive tape sheet 310.

The substrate support 130 may move upward to position the substrate S in the tape sheet sticking position, and then a vacuum may be created within the first inner space C1 and the second inner space C2.

Figure 17:
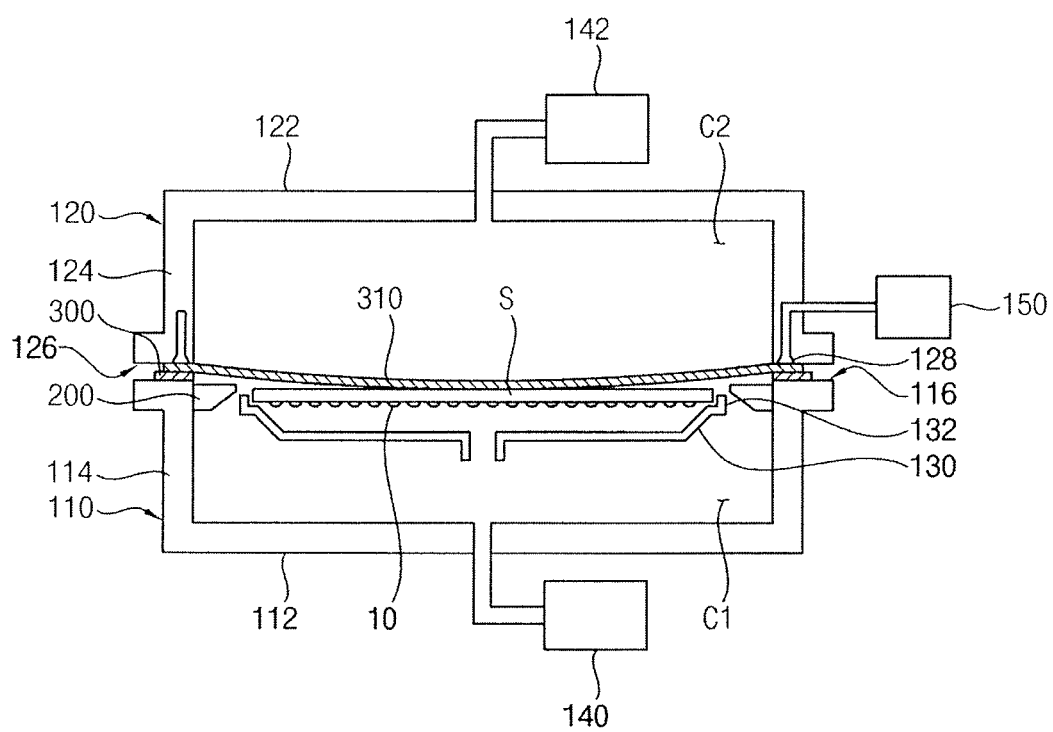

Referring to FIGS. 17 and 18, a differential pressure between the first inner space C1 and the second inner space C2 may be generated to bend the adhesive tape sheet 310 downward such that the adhesive tape sheet 310 may be attached to the substrate S.

As an example, an atmospheric pressure may be introduced to the second inner space C2 such that a pressure within the second inner space C2 may become greater than a pressure within the first inner space C1. Thus, the differential pressure between the first inner space C1 and the second inner space C2 may be generated, and thus, the adhesive tape sheet 310 may be drawn toward the first inner space C1.

The differential pressure may cause the adhesive tape sheet 310 to cave and bend downward such that the adhesive tape sheet 310 may first contact a substantially central portion of the substrate S and may then gradually contact the substrate S from the center of the substrate S toward a periphery edge of the substrate S, thus adhering the adhesive tape sheet 310 to substantially an entire upper surface of the substrate S. Thus, no air bubble or wrinkle may be formed between the adhesive tape sheet 310 and the substrate S, and thus, the adhesive tape sheet 310 may be adhered substantially uniformly to the substrate S.

Referring to FIG. 19, the differential pressure may be released, and then, the substrate S stuck with the adhesive tape sheet 310 on the ring frame 300 may be unloaded.

First, an atmospheric pressure may be introduced to the first inner space C1 such that the pressure within the second inner space C2 may become substantially equal to the pressure within the first inner space C1. Then, the upper chamber 120 may travel upward to open the chamber. The ring frame 300 may be suction-held and supported by the suction pad 128 in the lower edge 126 of the second sidewall 124.

Then, the suction plate of the ring frame transfer mechanism may the bottom surface 302 of the ring frame 300 and unload the substrate S from the adhesive tape sticking apparatus 100.

Referring to FIGS. 20 and 21, the substrate S mounted on the ring frame 300 may be cut into a plurality of dies by a sawing process, and the adhesive tape sheet 310 may be expanded to separate the dies.

According to an exemplary embodiment of the present inventive concept, after the substrate S is adhered to the adhesive tape sheet 310 on the ring frame 300, the substrate S may be cut into a plurality of chips by a sawing device without performing a heating process for heating the stretched portion to shrink.

Then, the adhesive tape sheet 310 may be expanded by the tape expanding device such that the diced chips on the adhesive tape sheet 310 may be radially spread apart. The separated chip may each include first to third dies D1, D2 and D3 stacked on one another.

Then, each of the separated chips may be packaged to form a 3D semiconductor package.

The above processes may be iterated to manufacture semiconductor packages including logic devices and memory devices. For example, the semiconductor package may include logic devices such as central processing units (CPUs), main processing units (MPUs), or application processors (APs), and volatile memory devices such as DRAM devices, SRAM devices, or HBM devices, or non-volatile memory devices such as flash memory devices, PRAM devices, MRAM devices, or ReRAM devices.

While the present inventive concept has been particularly shown and described with reference to exemplary embodiments thereof, it will be understood by those of ordinary skill in the art that various changes in form and details may be made therein without departing from the spirit and scope of the present inventive concept.

What is claimed is:

1. An adhesive tape sticking apparatus, comprising:
   a chamber including a lower chamber and an upper chamber, wherein the lower chamber comprises a first inner space and the upper chamber comprises a second inner space, and wherein an adhesive tape sheet is positioned between the upper chamber and the lower chamber;
   a substrate support movable upward and downward within the lower chamber and configured to support a substrate;
   a differential pressure generator configured to generate a differential fluid pressure between the first inner space and the second inner space, wherein a fluid pressure of the first inner space is less than a fluid pressure of the second inner space; and
   a tape support plate positioned between a first sidewall of the lower chamber and a circumferential edge of the substrate,
   wherein the tape support plate is configured to contact at least a first portion of the adhesive tape sheet and the substrate is configured to contact at least a second portion of the adhesive tape sheet when the adhesive tape sheet bends downward toward the first inner space when the differential fluid pressure is generated between the first and second inner spaces.

2. The adhesive tape sticking apparatus of claim 1, wherein the tape support plate comprises a plurality of protrusions on an upper surface of the tape support plate.

3. The adhesive tape sticking apparatus of claim 2, wherein a diameter of the protrusion ranges from about 100 µm to about 1,000 µm.

4. The adhesive tape sticking apparatus of claim 1, wherein an upper surface of the tape support plate is substantially aligned with or higher than an upper surface of the substrate along a direction substantially parallel to the upper surface of the substrate.

5. The adhesive tape sticking apparatus of claim 1, wherein the tape support plate has an annular shape.

6. The adhesive tape sticking apparatus of claim 1, further comprising an auxiliary ring extendable from an inner surface of the tape support plate toward the circumferential edge of the substrate.

7. The adhesive tape sticking apparatus of claim 6, wherein the auxiliary ring comprises a first auxiliary ring and a second auxiliary ring respectively positioned adjacent to opposite sides of the substrate.

8. The adhesive tape sticking apparatus of claim 1, wherein the tape support plate comprises a first mask wing and a second mask wing respectively positioned adjacent to opposite sides of the substrate.

9. The adhesive tape sticking apparatus of claim 8, wherein the first mask wing and the second mask wing are movable along a direction from the first sidewall of the lower chamber to the circumferential edge of the substrate.

10. The adhesive tape sticking apparatus of claim 1, wherein the differential fluid pressure generator comprises:
   a first vacuum device connected to the lower chamber to selectively create the fluid pressure of the first inner space, and
   a second vacuum device connected to the upper chamber to selectively create the fluid pressure of the second inner space.

11. An adhesive tape sticking apparatus, comprising:
   a lower chamber including a bottom wall and a first sidewall defining a first inner space;
   an upper chamber including a top wall and a second sidewall defining a second inner space;
   a substrate support, wherein the substrate support is movable upward and downward within the lower chamber, and wherein the substrate support is configured to support a substrate;
   a differential pressure generator configured to generate a differential pressure between the first inner space and the second inner space when an adhesive tape sheet is disposed between the lower chamber and the upper chamber; and
   a tape support plate extending from an inner surface of an upper portion of the first sidewall toward a circumferential edge of the substrate,
   wherein the tape support plate and the substrate are configured to contact the adhesive tape sheet when the adhesive tape sheet bends downward toward the first inner space when the differential pressure is generated between the first and second inner spaces.

12. The adhesive tape sticking apparatus of claim 11, wherein the tape support plate comprises a plurality of protrusions on an upper surface of the tape support plate.

13. The adhesive tape sticking apparatus of claim 11, wherein an upper surface of the tape support plate is substantially aligned with or higher than an upper surface of the substrate along a direction substantially parallel to the upper surface of the substrate.

14. The adhesive tape sticking apparatus of claim 11, further comprising an auxiliary plate installed extendable from an inner surface of the tape support plate toward the circumferential edge of the substrate.

15. The adhesive tape sticking apparatus of claim 11, wherein the tape support plate comprises a first mask wing and a second mask wing respectively positioned adjacent to opposite sides of the substrate.

16. An apparatus, comprising:
   a first chamber comprising a first inner space;
   a second chamber comprising a second inner space;
   an adhesive tape sheet coupled to a ring frame, wherein the ring frame is disposed between the first chamber and the second chamber, and wherein the adhesive tape sheet creates an air tight seal between the first inner space and the second inner space;
   a first vacuum device connected to the first inner space, wherein the first vacuum device is configured to create a first pressure in the first inner space;
   a second vacuum device connected to the second inner space, wherein the second vacuum device is configured to create a second pressure in the second inner space; and
   a tape support plate disposed on a sidewall of one of the first and second chambers, wherein the tape support plate is positioned, shaped and dimensioned to contact and support at least a portion of the adhesive tape sheet when a pressure difference between the first and second inner spaces causes the adhesive tape sheet to bend toward the tape support plate,
   wherein the tape support plate is moveable along the sidewall of one of the first and second chambers, and
   wherein when the pressure difference is generated, the adhesive tape sheet rests substantially flat across an upper surface of the substrate to an adjacent edge of the tape support plate.

17. The apparatus of claim 16, further comprising a suction pad disposed in a sidewall of at least one of the first and second chambers, wherein the suction pad is configured to connect with the adhesive tape sheet.

18. The apparatus of claim 16, further comprising a substrate support.

19. The apparatus of claim 16, wherein the tape support plate comprising a first mask wing and a second mask wing.

* * * * *